United States Patent
Lim et al.

(10) Patent No.: US 9,768,756 B2
(45) Date of Patent: Sep. 19, 2017

(54) LOW POWER INTEGRATED CLOCK GATING CELL WITH INTERNAL CONTROL SIGNAL

(71) Applicants: James Jung Lim, Austin, TX (US); Matthew Berzins, Cedar Park, TX (US)

(72) Inventors: James Jung Lim, Austin, TX (US); Matthew Berzins, Cedar Park, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/079,045

(22) Filed: Mar. 23, 2016

(65) Prior Publication Data

US 2017/0201241 A1    Jul. 13, 2017

Related U.S. Application Data (60) Provisional application No. 62/276,798, filed on Jan. 8, 2016.

(51) Int. Cl.
 *H03K 3/356* (2006.01)
 *H03K 3/012* (2006.01)

(52) U.S. Cl.
 CPC ....... *H03K 3/356165* (2013.01); *H03K 3/012* (2013.01)

(58) Field of Classification Search
 CPC ............. H03K 3/012; H03K 3/356052; H03K 3/356147; H03K 3/356165
 USPC ....... 327/185, 199, 208, 210, 211, 212, 214, 327/215, 225, 365
 See application file for complete search history.

(56) References Cited

U.S. PATENT DOCUMENTS

| | | | |
|---|---|---|---|
| 5,892,729 A | 4/1999 | Holder, Jr. | |
| 6,204,695 B1 * | 3/2001 | Alfke | G06F 1/10 326/93 |
| 7,849,428 B2 | 12/2010 | Barowski et al. | |
| 8,643,411 B1 | 2/2014 | Goyal et al. | |
| 9,000,806 B2 | 4/2015 | Elvey et al. | |
| 2012/0139590 A1 * | 6/2012 | Myers | G06F 1/10 327/113 |
| 2015/0200669 A1 * | 7/2015 | Cai | H03K 3/356052 327/211 |

* cited by examiner

*Primary Examiner* — William Hernandez
(74) *Attorney, Agent, or Firm* — Renaissance IP Law Group LLP

(57) ABSTRACT

According to one general aspect, an apparatus may include a latch, and a control circuit. The latch may receive an input enable signal and generate a latched enable signal. The latch may also pass the input enable signal to the latched enable signal when the latch is transparent. The control circuit may be electrically coupled to the latch. The control circuit may receive as input an ungated clock signal, and generate a gated clock signal and a latch control signal. The latch control signal may be configured to make the latch transparent when the ungated clock signal is in a predefined state and when one of the input enable signal and the latched enable signal are in an enabled state. The control circuit may be configured to pass the ungated clock signal to the gated clock signal when the latched enable signal is in the enabled state.

17 Claims, 5 Drawing Sheets

FIG. 5

LOW POWER INTEGRATED CLOCK GATING CELL WITH INTERNAL CONTROL SIGNAL

CROSS-REFERENCE TO RELATED APPLICATION

This application claims priority under 35 U.S.C. §119 to Provisional Patent Application Ser. No. 62/276,798, entitled "A LOW POWER INTEGRATED CLOCK GATING CELL WITH INTERNAL CONTROL SIGNAL" filed on Jan. 8, 2016. The subject matter of this earlier filed application is hereby incorporated by reference.

TECHNICAL FIELD

This description relates to power management, and more specifically to a low power integrated clock gating cell with an internal control signal.

BACKGROUND

Clock gating is a popular technique used in many synchronous circuits for reducing dynamic power dissipation. Clock gating generally saves power by adding more logic to a circuit to dynamically prune the clock tree. Dynamically pruning the clock tree often involves disabling portions of the circuitry so that the flip-flops or other synchronous devices in the execution units do not have to switch states. Switching states consumes power. When synchronous devices are prevented from or do not switch, the switching power consumption generally goes to zero, and only leakage currents are incurred.

Clock gating typically works by sending an enable signal to regional clock circuits, and using the enable signal to gate the clocks. This may be done by, for example, ANDing an inverted version of the enable and the global clock signal to generate the regional clock signal. If the enable signal indicates the clock should be disabled, the output of the AND gate will be low regardless of the state of the clock. Clock gating logic is generally manifested in the form of "integrated clock gating" (ICG) cells or circuits.

Traditionally, the ICGs make use of a latch to hold the value of the enable signal. This latch is traditionally controlled by the clock signal itself. This generally prevents the ICG from gating the clock midway through a clock cycle, which would result in a glitch. However, it also means that the ICG consumes switching power even when the regional clock is being gated, as the global or ungated clock is switching the latch portion of the ICG.

SUMMARY

According to one general aspect, an apparatus may include a latch, and a control circuit. The latch may be configured to receive an input enable signal and generate a latched enable signal. The latch may also be configured to pass the input enable signal to the latched enable signal when the latch is transparent. The control circuit may be electrically coupled to the latch. The control circuit may be configured to receive as input an ungated clock signal, and generate a gated clock signal and a latch control signal. The latch control signal may be configured to make the latch transparent when the ungated clock signal is in a predefined state and when one of the input enable signal and the latched enable signal are in an enabled state. The control circuit may be configured to pass the ungated clock signal to the gated clock signal when the latched enable signal is in the enabled state.

According to another general aspect, a method may include receiving, by an integrated clock gating circuit, an ungated clock signal and an input enable signal. The method may also include generating, by an integrated clock gating circuit, a latch control signal configured to make the latch transparent only when the ungated clock signal is in a predefined state and either the input enable signal or a latched enable signal are in an enabled state. The method may include latching, as dictated by the latch control signal, the input enable signal to form the latched enable signal. The method may include generating, by an integrated clock gating circuit, a gated clock signal based upon the latched enable signal and the ungated clock signal.

According to another general aspect, an apparatus may include an execution unit, a clock circuit, and an integrated clock gating circuit. The execution unit may be configured to perform a logic function in accordance with a gated clock signal. The clock circuit may be configured to generate an ungated clock signal. The integrated clock gating circuit may be configured to generate the gated clock signal from the ungated clock signal and at least one input enable signal. The integrated clock gating circuit may include a latch, and a control circuit. The latch may be configured to receive an input enable signal and generate a latched enable signal. The latch may also be configured to pass a value from the input enable signal to the latched enable signal only when the latch is transparent. The control circuit may be configured to receive as input an ungated clock signal, and generate a gated clock signal and a latch control signal. The latch control signal may be configured to make the latch transparent only when the ungated clock signal is in a predefined state and either the input enable signal or the latched enable signal are in an enabled state. The control circuit may be configured to pass a value from the ungated clock signal to the gated clock signal when the latched enable signal is in the enabled state.

The details of one or more implementations are set forth in the accompanying drawings and the description below. Other features will be apparent from the description and drawings, and from the claims.

A system and/or method for power management, and more specifically to a low power integrated clock gating cell with an internal control signal, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
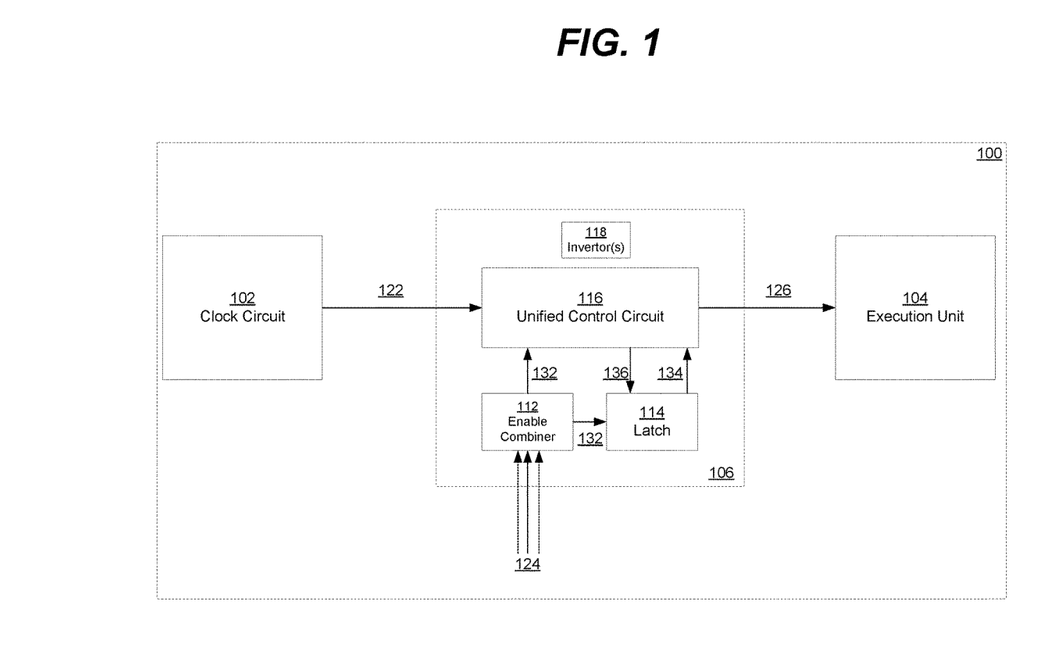
FIG. 1 is a block diagram of an example embodiment of a system in accordance with the disclosed subject matter.

FIG. 1 is a block diagram of an example embodiment of a system 100 in accordance with the disclosed subject matter. In various embodiments, the system 100 may be included as part of an integrated circuit, such as a microprocessor, memory chip, or system-on-a-chip, although, it is understood that the above are merely a few illustrative examples to which the disclosed subject matter is not limited.

In various embodiments, the system 100 may include one or more execution units 104 configured to execute one or more instructions. Examples of execution units 104 may include, but are not limited to, instruction fetch units, instruction decode units, arithmetic logic units, floating point units, load/store units, but other forms of execution units are contemplated. The execution unit 104 may include synchronous circuits or logic functions that rely upon a clock signal (e.g., a gated clock signal 126) to operate. As described above, occasionally this clock signal may be turned off or gated.

In the illustrated embodiment, the system 100 includes a clock circuit 102. This clock circuit 102 may be configured to generate a clock signal, or more specifically a global or ungated clock signal 122. In various embodiments, the clock circuit 102 may include a phase lock loop (PLL) or other oscillator circuits, although, it is understood that the above are merely a few illustrative examples to which the disclosed subject matter is not limited.

In the illustrated embodiment, the system 100 also includes an integrated clock gate (ICG) cell or a circuit 106. In some embodiments, the ICG may be referred to as an integrated clock gater. The ICG may be configured to gate or disable the gated clock signal 126 when instructed by an enable signal 124. In such an embodiment, this may effectively turn off, in whole or part, the execution unit 104 and save power consumed by the execution unit 104. For example, if the execution unit 104 is a floating-point unit and no floating point instructions are being executed, the ICG 106 may gate or disable the gated clock signal 126 turning off the execution unit 104. When a floating point instruction is encountered, the ICG 106 may enable the gated clock signal 126 and turn the floating point unit back on (in order to process the floating point instruction). It is understood that the above is merely an illustrative example to which the disclosed subject matter is not limited.

In the illustrated embodiment, the ICG 106 may receive the global or ungated clock signal 122 and at least one enable signal 124. The ICG 106 generates a gated clock signal 126. It is understood that the gated clock signal 126 is so named because the clock signal is potentially gated or disabled, and does not indicate that the clock signal has been currently gated or disabled. Such gating or disabling may be dependent upon the value of the enable signal 124.

Figure 4:
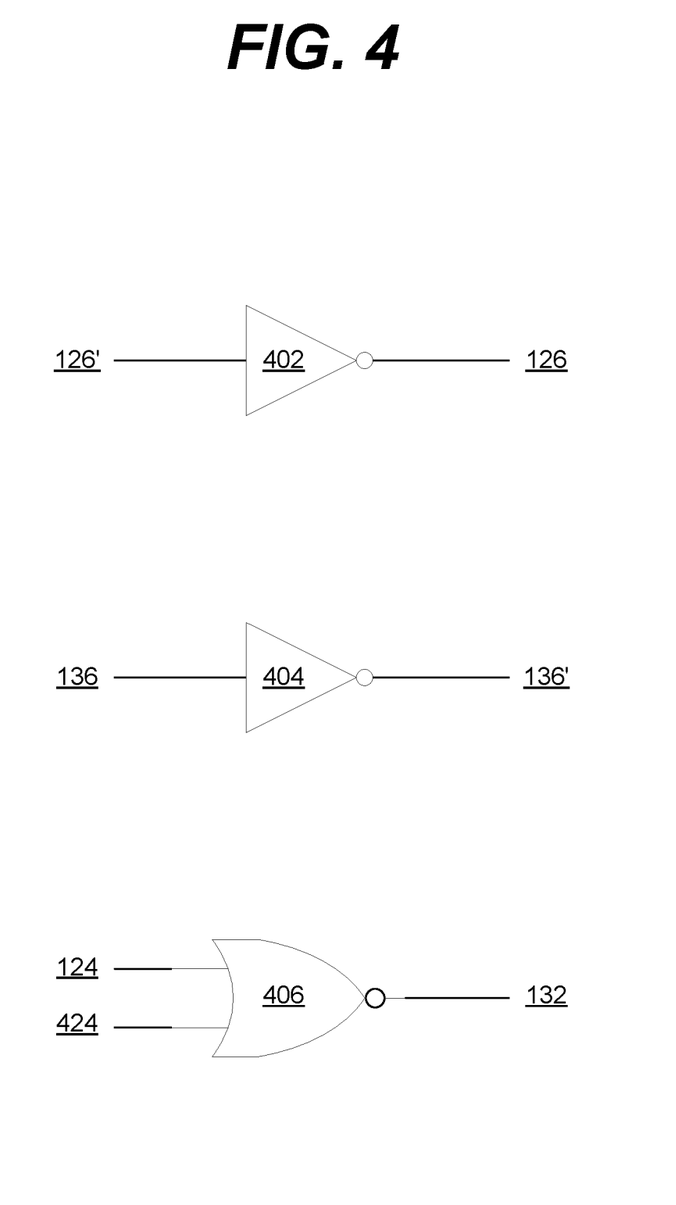
FIG. 4 is a block diagram of an example embodiment of a series of circuits in accordance with the disclosed subject matter.

In the illustrated embodiment, the ICG 106 includes an enable combiner circuit 112. The enable combiner circuit 112 may be configured to combine a plurality of enable signals 124 into a single enable signal, inverted enable signal 132. A detailed example embodiment of an enable combiner circuit 112 is shown in FIG. 4. Example enable signals 124 may include, but are not limited to, an execution unit 104 specific enable signal, a debug or scan-chain enable signal, a chip-wide enable signal; it is understood that the above are merely a few illustrative examples to which the disclosed subject matter is not limited. In various embodiments, the process of combining the enable signals 124 may invert the voltage value of the signals, such that a high enable value of enable signal 124 may be equivalent to a low enable value for combined and inverted enable signal 132. It is understood that the above is merely one illustrative example to which the disclosed subject matter is not limited.

Figure 2:
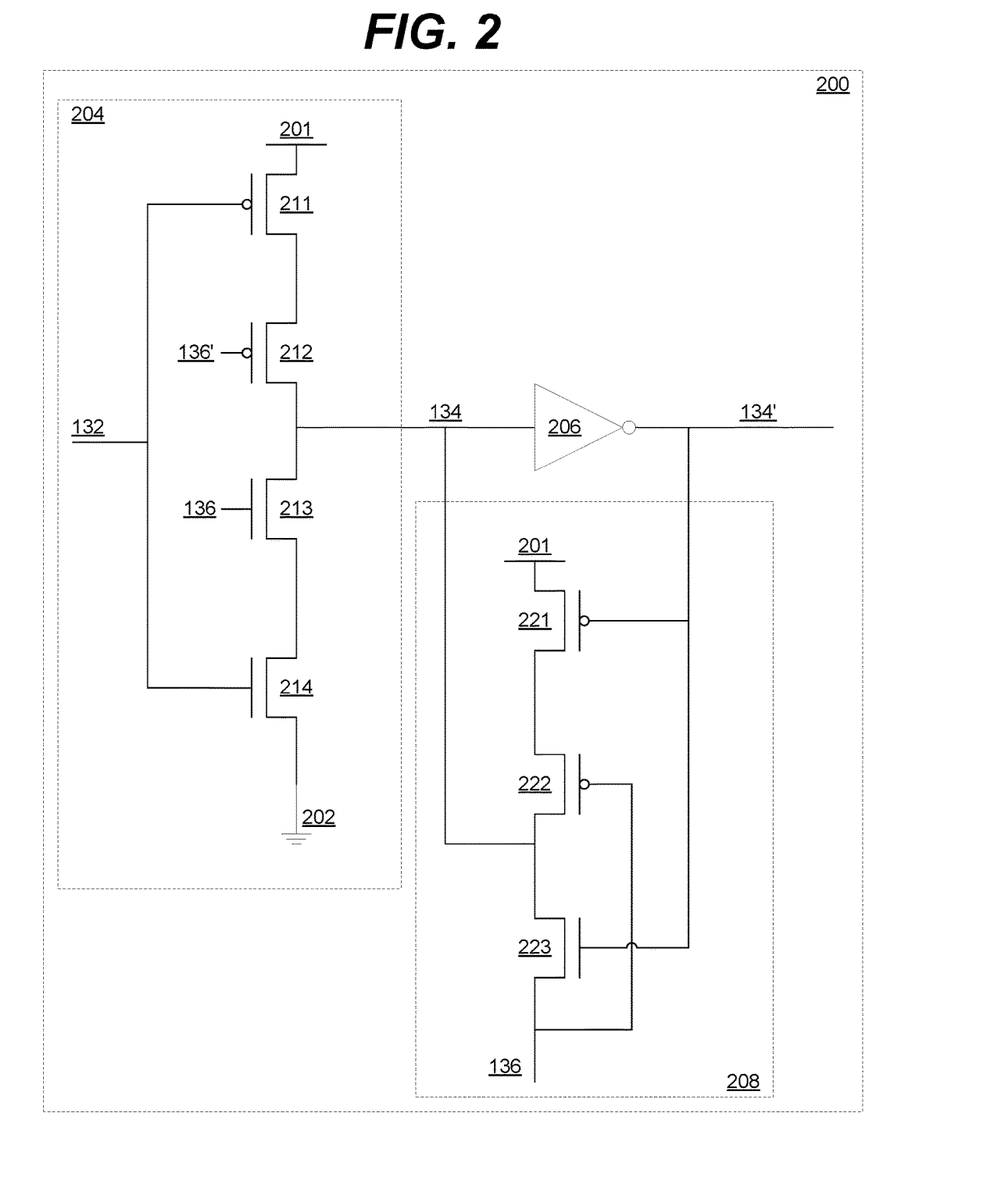
FIG. 2 is a block diagram of an example embodiment of an apparatus in accordance with the disclosed subject matter.

In the illustrated embodiment, the ICG 106 includes a latch circuit 114 configured to store, at least temporarily, the inverted enable signal 132. In the illustrated embodiment, the latch circuit 114 may be controlled, at least in part, by the internal control signal 136 and not by the ungated clock signal 122. The latch circuit 114 may receive the inverted enable signal 132 as input and generate or output a latched enable signal 134. An example embodiment of the latch circuit 114 is shown in FIG. 2 and described below.

In the illustrated embodiment, the ICG 106 includes a unified control circuit 116. The unified control circuit 116 may be unified or integrated in the sense that it generates not only the internal control signal 136 but also the gated clock signal 126. The unified control circuit 116 may gate or disable the gated clock signal 126 when instructed to do so by the latched enable signal 134 (e.g., when the latched enable signal 134 is in an enabled state or value). Further, the unified control circuit 116 may be configured to set the value of the control signal 136 such that the latch circuit is transparent only when the ungated clock signal 122 is in a predefined state (e.g., voltage low) and either the inverted input enable signal 132 or the latched enable signal 134 are in an enabled state (e.g., voltage low or high, respectively). An example embodiment of the unified control circuit 116 is shown in FIG. 3 and described below.

Further, in various embodiments, the ICG 106 may include one or more invertors 118 or other logical circuits. Some examples of these inverters are illustrated by FIG. 4 and discussed below. For example, because of the nature of complementary metal-oxide semiconductor (CMOS) logic, the unified control circuit 116 may generate inverted versions of the gated clock signal 126 and control signal 136, and the invertors 118 may simply invert the voltage values to a more desirable form. It is understood that the above are merely a few illustrative examples to which the disclosed subject matter is not limited.

In the illustrated embodiment, the ICG's 106 use of the internal control signal 136, instead of the traditional ungated clock signal 122, to control the latching of the inverted enable signal 132 may reduce switching power consumption (compared to a traditional ICG). When the gated clock signal 126 is disabled, the internal control signal 136 may remain at a constant state (until the enable signal 124 changes). This causes the latch circuit 114 to not consume switching power as the transistors of the latch circuit 114 may not change state.

Figure 3:
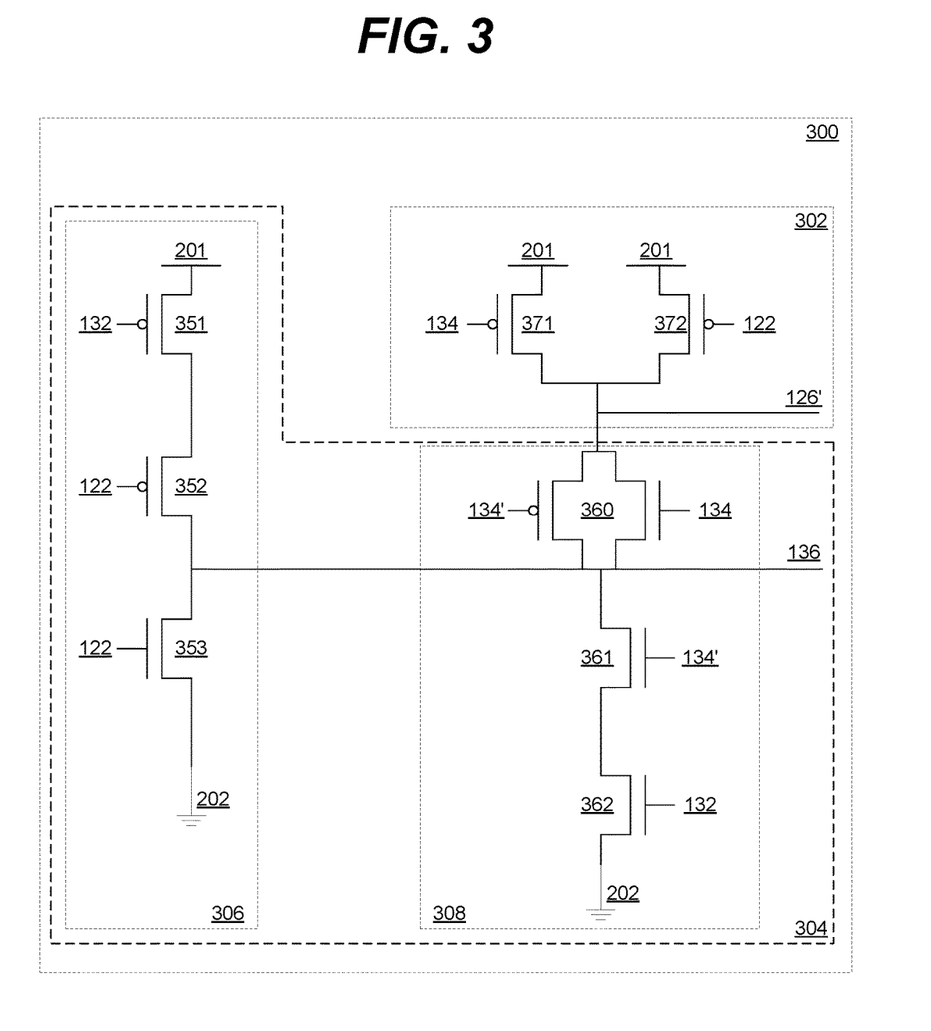
FIG. 3 is a block diagram of an example embodiment of an apparatus in accordance with the disclosed subject matter.

Further, as seen in FIGS. 2 and 3, the number of transistors receiving the ungated clock signal 122 may be reduced from traditional ICG implementations. This may reduce the pin capacitance (compared to traditional designs), which in turn may provide a power savings regardless of whether the ungated clock signal 122 is enabled or disabled.

In various embodiments, the ICG 106 may, when the ungated clock signal 122 is disabled, consume less than 50% of the power consumed by a traditional ICG. Other advantages of the illustrated ICG compared to other ICGs may exist. It is understood that the above are merely a few illustrative examples to which the disclosed subject matter is not limited.

FIG. 2 is a block diagram of an example embodiment of an electronic apparatus 200 in accordance with the disclosed subject matter. In various embodiments, the electronic apparatus 200 may include a latch circuit as illustrated in FIG. 1. It is understood that the below is merely one illustrative example to which the disclosed subject matter is not limited.

In the illustrated embodiment, the apparatus 200 includes a latch portion 204. The latch portion 204 may be configured to receive an inverted input enable signal 132 and generate a latched enable signal 134. The latch portion 204 may also be configured to pass a value from the inverted input enable signal 132 to the latched enable signal 134 only when the latch is transparent.

In the illustrated embodiment, the latch portion 204 includes four transistors 211, 212, 213, and 214 connected in series between a voltage source 201 and a voltage sink 202 (e.g., ground). The transistors 211 and 212 may include p-channel metal-oxide-semiconductor field-effect (PMOS) transistors, whereas, transistors 213 and 214 may include n-channel metal-oxide-semiconductor field-effect (NMOS) transistors. The latched enable signal 134 may be output at the junction of the PMOS and NMOS transistors, illustrated as transistors 212 and 213.

In the illustrated embodiment, the inverted input enable signal 132 controls the first and fourth latch transistors 211 and 214 by being input to each gate terminal of the first and fourth latch transistors 211 and 214, such that only one of the first and fourth latch transistors 211 and 214 are open or active at a time and pulling the output (latched enable signal 134) either to the voltage source 201 or to the voltage sink 202. In the illustrated embodiment, this allows the latch portion 204 to pass the value of the inverted input enable signal 132 to the latched enable signal 134.

The latch portion 204 may be controlled by the control signal 136 and the inverted control signal 136'. In the illustrated embodiment, the inverted control signal 136' controls the PMOS transistor by being input to the gate terminal of the PMOS transistor 212. Conversely, the control signal 136 controls the NMOS transistor 213 by being input to the gate terminal of the NMOS transistor 213. In such an embodiment, when the control signal 136 is high, enabled, or active the transistors 212 and 213 may be turned on or open. This may in turn make the latch portion 204 transparent and allow the transistors 211 and 214 to pass the value of the inverted input enable signal 132 to the latched enable signal 134. Conversely, if the control signal 136 is low, disabled, or inactive the transistors 212 and 213 may be turned off or closed. This may in turn prevent the latch portion 204 from being transparent and prevent the transistors 211 and 214 from passing the value of the inverted input enable signal 132 to the latched enable signal 134.

In the illustrated embodiment, the apparatus 200 includes a feedback portion 208 and an inverter 206. In various embodiments, the invertor 206 may be considered part of the feedback portion 208. The invertor 206 may be configured to convert the latched enable signal 134 to the inverted latched enable signal 134'.

The feedback portion 208 may be configured to invert and feedback the inverted latched enable signal 134' to generate or maintain the latched enable signal 134, when the latch portion 204 is not transparent. In the illustrated embodiment, the feedback portion 208 includes the transistors 221, 222, and 223 arranged in series between the voltage source 201 and the control signal 136, acting as a voltage sink. The transistors 221 and 222 may include PMOS transistors, and transistor 223 may include an NMOS transistor. The junction between the transistors 222 and 223 may be the output for the fed-back latched enable signal 134.

In the illustrated embodiment, the inverted latched enable signal 134' controls the transistors 221 and 223 by being input to each gate terminal of the transistors 221 and 223. As such, the value of the inverted latched enable signal 134' may turn on/off the transistors 221 and 223 and pull the output voltage up to the voltage source 201 or to the value of the control signal 136. Likewise, the control signal 136 may control or be input to the gate terminal of the transistor 222. In such an embodiment, the control signal 136 may disable the feedback portion 208 and allow latch portion to set the value of the latched enable signal 134.

As described above, the apparatus 200 may be controlled by the control signal 136 and not a clock signal. In various embodiments, this may prevent the apparatus 200 from consuming switching power when the ICG is actively gating the clock and therefore the apparatus 200 is disabled.

FIG. 3 is a block diagram of an example embodiment of an electronic apparatus 300 in accordance with the disclosed subject matter. In various embodiments, the electronic apparatus 300 may include a unified control circuit as illustrated in FIG. 1. It is understood that the below is merely one illustrative example to which the disclosed subject matter is not limited.

In the illustrated embodiment, the apparatus 300 includes a clock gating portion 302 and a latch control portion 304. The clock gating portion 302 may be configured to generate the gated clock signal 126, or as illustrated the inverted gated clock signal 126'. In various embodiments, an inverter (illustrated in FIG. 4) may convert the inverted gated clock signal 126' to the gated clock signal 126 before it is input to an execution unit. The latch control portion 304 may be configured to generate the latch control signal 136.

In the illustrated embodiment, the clock gating portion 302 includes two transistors 371 and 372 arranged in parallel between the voltage source 201 and the transmission gate 360 of the latch control portion 304. The inverted gated clock signal 126' may be output from the drain terminals of the PMOS transistors 371 and 372.

In the illustrated embodiment, the ungated clock signal 122 may control or be input to the gate terminal of the second clock gating transistor 372. And, the latched enable signal 134 may control or be input to the gate terminal of the first clock gating transistor 371. In such an embodiment, when the latched enable signal 134 is in a disabled state or low, the value of the inverted gated clock signal 126' may be pulled to the voltage source 201. Conversely, when the latched enable signal 134 is in an enabled state or high, the first clock gating transistor 371 may be turned off or not conducting. Likewise, when the ungated clock signal 122 is low, inverted gated clock signal 126' is pulled high regardless of the enable state of the latched enable signal 134. As the ungated clock signal 122 goes high, the enable state of the latched enable signal 134 controls the signal of inverted gated clock signal 126'.

In the illustrated embodiment, the latch control portion 304 includes a clocked portion 306 and an enable portion 308. These portions 306 and 308 may be so named based upon the predominate type of signal associated with the various transistors' gate terminals. The structures of the portions 306 and 308 of the latch control portion 304 are described below. In addition, two illustrative examples of the working of the latch control portion 304 are described below.

In the illustrated embodiment, the clocked portion 306 includes three transistors 351, 352, and 353 arranged in series between the voltage source 201 and the voltage sink 202. The inverted enable signal 132 may control or be input to the gate terminal of the PMOS transistor 351. The ungated clock signal 122 may control or be input to the gate terminals of the PMOS transistor 352 and the NMOS transistor 353. The junction of the transistors 352 and 353 may output the control signal 136.

In the illustrated embodiment, the enable portion 308 may be arranged, at least in part, in parallel to the clocked portion 306. The enable portion 308 may include a transmission gate 360 and two transistors 361 and 362 arranged in series between the clock gating portion 302 and the voltage sink 202. The transmission gate 360 may be controlled by the latched enable signal 134 (and the inverted latched enable signal 134'). The inverted latched enable signal 134' may control or be input to the gate terminal of the NMOS transistor 361. The inverted enable signal 132 may control or be input to the gate terminal of the NMOS transistor 362. The junction between the transmission gate 360 and the transistor 361 may output the control signal 136.

In a first illustrative example of the working of the apparatus 300, the latched enable signal 134 and the inverted enable signal 132 may both be low or in a disabled state. In such an embodiment, the transistor 371 may be open, pulling the inverted gated clock signal 126' to the voltage source 201 or high.

The transmission gate 360 may be closed, and the value of the inverted gated clock signal 126' is not passed to, or may be isolated from the control signal 136. Likewise, the transistor 351 may be closed, preventing the clocked portion 306 from pulling the control signal 136 up to the voltage source 201.

Conversely, transistors 361 and 362 may be open and pull the control signal 136 down to the voltage sink 202. Referring back to FIG. 2, a low or disabled version of the control signal 136 may prevent the latch portion 204 from passing the inverted enable signal 132 to the latched enable signal 134. The disabled control signal 136 may prevent the apparatus 200 from consuming any power due to the transistors switching state.

In another embodiment, the latched enable signal 134 and the inverted enable signal 132 may both be in an enabled state (e.g., high and low, respectively). In such an embodiment, the transistor 371 is closed, and the inverted gated clock signal 126' follows (in inverted form) the ungated clock signal 122.

The transmission gate 360 may be open or transparent, and the value of the inverted gated clock signal 126' may be passed to the control signal 136. Conversely, the transistors 361 and 362 may be closed, preventing the control signal 136 from being pulled to the voltage sink 202.

Regarding the clock portion 306, the transistor 351 may be open. This allows the ungated clock signal 122 to open and close the transistors 352 and 353, alternately pulling the control signal 136 up or down to the voltage source 201 or sink 202. It is noted that the value of the control signal 136 will be the inverse of the ungated clock 122.

In such an embodiment, a path to the voltage source 201 may be available if either the latched enable signal 134 or the enable signal 132 are in an enabled state. If the inverted enable signal 132 is low, the transistor 351 will be open providing a path through the clocked portion 306. Conversely, if the latched enable signal 134 is high the transmission gate 360 will be open or transparent, providing a path through the clock gating portion 302.

Referring back to FIG. 2, a high or enabled version of the control signal 136 may allow the latch portion 204 to be transparent or pass the enabled state of the inverted enable signal 132 to the latched enable signal 134. In such an embodiment, the latch may be transparent only when the ungated clock signal is in a low or predefined state and either the inverted input enable signal or the latched enable signal are in an enabled or high state. It is understood that the above are merely a few illustrative examples to which the disclosed subject matter is not limited.

FIG. 4 is a block diagram of an example embodiment of a series of circuits in accordance with the disclosed subject matter. In various embodiments, the ancillary circuits or logic gates may be employed to adjust various signals to a more desirable format. It is understood that the illustrated circuits are merely a few illustrative examples to which the disclosed subject matter is not limited.

For example, the invertor 402 may be employed to convert the inverted gated clock signal 126' to the gated clock signal 126. This may be desirable as the nature of the CMOS logic may cause the unified control circuit to create an inverted gated clock signal 126'. In some embodiments, the invertor 402 may be included in the unified control circuit.

Likewise, the invertor 404 may be employed to convert the control signal 136 to the inverted control signal 136'. This may be desirable to allow the control signal 136 to control any PMOS transistors, such as those in various embodiment of the latch circuit. In some embodiments, the invertor 404 may be included in the latch circuit.

In the illustrated embodiment, the NOR gate 406 may be included in an enable combiner circuit. In such an embodiment, the NOR gate 406 may receive a plurality of enable signals, such as the enable signal 124 and a debug or scan enable signal 424, and may combine them into an inverted input enable signal 132. In one example, the enable signal 124 may be configured to cause a regional clock signal, for example, to a particular execution unit, to be gated during normal device operation. In another example, the scan enable signal 424 may be configured to cause a regional clock signal to be gated when the device is in a debug mode, such as when a scan chain is being used. It is understood that the above are merely a few illustrative examples to which the disclosed subject matter is not limited.

Figure 5:
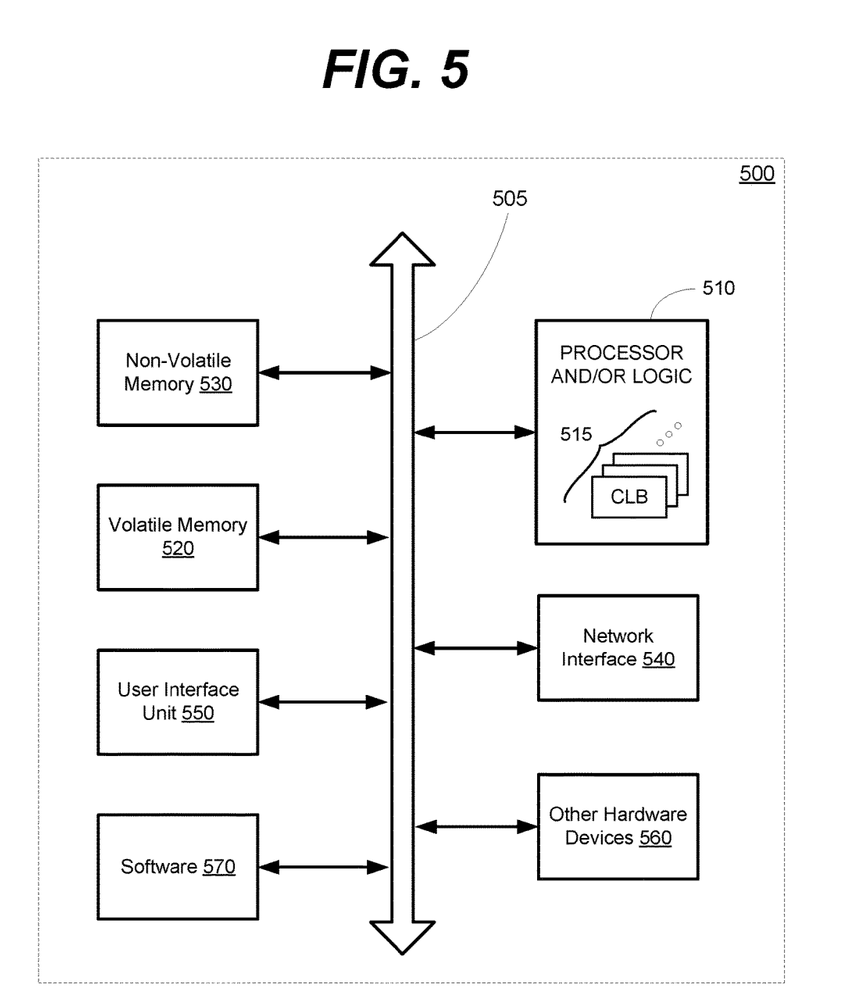
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter. Specifically, in various embodiments, semiconductor devices formed according to principles of the disclosed subject matter may be included in any of the components of system 500, such as any combination of, but not limited to, the processor 510, the volatile memory 520, the non-volatile memory 530, the network interfaces 540, and/or the one or more other devices or hardware components 560, and so on. It is understood that the above are merely a few illustrative examples to which the disclosed subject matter is not limited. Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers, and so on, or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR, and so on), stabilizing logic devices (e.g., flip-flops, latches, and so on), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM), and so on). The information processing system 500 according to the disclosed subject matter may further include a non-volatile memory 530 (e.g., a hard drive, an optical memory, a NAND or Flash memory, and so on). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n, and so on. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+), and so on. Examples of a wired protocol may include, but are not limited to, IEEE 802.3 (a.k.a. Ethernet), Fibre Channel, Power Line communication (e.g., HomePlug, IEEE 1901), and so on. It is understood that the above are merely a few illustrative examples to which the disclosed subject matter is not limited.

The information processing system 500 according to the disclosed subject matter may further include a user interface unit 550 (e.g., a display adapter, a haptic interface, a human interface device, and so on). In various embodiments, this user interface unit 550 may be configured to either receive input from a user and/or provide output to a user. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor, and so on). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540, and so on) of the information processing system 500. In such an embodiment, the information processing system 500 may include one or more native applications, which may be installed locally (e.g., within the non-volatile memory 530, and so on) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey, and so on) or a virtual execution machine (VM) (e.g., the Java Virtual Machine, the Microsoft Common Language Runtime, and so on) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, and so on). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
   a latch configured to receive an input enable signal and generate a latched enable signal, wherein the latch is also configured to pass the input enable signal to the latched enable signal when the latch is transparent;
   a control circuit that is electrically coupled to the latch, wherein the control circuit is configured to receive as input an ungated clock signal, and generate a gated clock signal and a latch control signal,
   wherein the latch control signal is configured to make the latch transparent when the ungated clock signal is in a predefined state and when one of the input enable signal and the latched enable signal is in an enabled state,
   wherein the control circuit is configured to pass the ungated clock signal to the gated clock signal when the latched enable signal is in the enabled state, and
   wherein the control circuit comprises:
   a clock gating portion configured to generate the gated clock signal, and
   a latch control portion configured to generate the latch control signal, wherein, when the latched enable signal is in the enabled state, an inverted gated clock signal is an input to the latch control portion.

2. The apparatus of claim 1, wherein the latch comprises:
a first latch transistor coupled to a voltage source and a second latch transistor and controlled by the input enable signal;
the second latch transistor coupled between the first latch transistor and a third latch transistor and controlled by an inverted latch control signal;
the third latch transistor coupled between the second latch transistor and a fourth latch transistor and controlled by the latch control signal;
the fourth latch transistor coupled between the third latch transistor and a voltage sink and controlled by the input enable signal; and
wherein the latched enable signal is generated, at least in part, by the voltage at a junction of the second latch transistor and the third latch transistor.

3. The apparatus of claim 2, wherein the latch comprises:
an inverter configured to invert the latched enable signal to an inverted latched enable signal; and
a feedback circuit comprising:
a first feedback transistor coupled between the voltage source and a second feedback transistor and controlled by the inverted latched enable signal,
the second feedback transistor coupled between the first feedback transistor and a third feedback transistor and controlled by the latch control signal,
the third feedback transistor coupled between the second feedback transistor and the latch control signal, and controlled by the inverted latched enable signal, and
wherein the latched enable signal is generated, at least in part, by the voltage at a junction of the second feedback transistor and the third feedback transistor.

4. The apparatus of claim 1, wherein the latch control portion includes:
a clocked portion comprising:
a first clocked transistor coupled between a voltage source and a second clocked transistor and controlled by the input enable signal,
the second clocked transistor coupled between the first clocked transistor and a third clocked transistor and controlled by the ungated clock signal, and
the third clocked transistor coupled between the second clocked transistor and a voltage sink and controlled by the ungated clock signal,
wherein the latch control signal is generated, at least in part, by the voltage at a junction of the second clocked transistor and the third clocked transistor; and
an enable portion comprising:
a transmission gate coupled between the clock gating portion and a first enable transistor and controlled by the latched enable signal,
the first enable transistor coupled between the transmission gate and a second enable transistor and controlled by an inverted latched enable signal, and
the second enable transistor coupled between the first enable transistor and the voltage sink and controlled by the input enable signal,
wherein the latch control signal is generated, at least in part, by the voltage at a junction of the transmission gate and the first enable transistor.

5. The apparatus of claim 1, wherein the latch does not consume switching power when the latch control signal is in a disabled state.

6. The apparatus of claim 1, wherein the gated clock signal is separated from the latch control signal by a switching element.

7. The apparatus of claim 1, wherein the ungated clock signal is input to the control circuit and not the latch, and
wherein dynamic power consumption is controlled, in part, by limiting a pin capacitance associated with the ungated clock signal to the control circuit and an invertor.

8. A method comprising:
receiving, by an integrated clock gating circuit, an ungated clock signal and an input enable signal;
generating, by the integrated clock gating circuit, a latch control signal configured to make the latch transparent only when the ungated clock signal is in a predefined state and either, or both of, the input enable signal or a latched enable signal are in an enabled state;
latching, as dictated by the latch control signal, the input enable signal to form the latched enable signal; and
generating, by the integrated clock gating circuit, a gated clock signal based, at least in part, upon the latched enable signal and the ungated clock signal,
wherein the integrated clock gating circuit comprises:
a clock gating portion configured to generate the gated clock signal, and
a latch control portion configured to generate the latch control signal,
wherein, when the latched enable signal is in the enabled state, an inverted gated clock signal is an input to the latch control portion.

9. The method of claim 8, wherein latching comprises:
passing a value from the input enable signal to the latched enable signal, when the latch control signal is in the enabled state; and
feeding the latched enable signal through two invertors to maintain a value of the latched enable signal,
wherein one of the two invertors comprises:
a first feedback transistor coupled between a voltage source and a second feedback transistor and controlled by an inverted latched enable signal,
the second feedback transistor coupled between the first feedback transistor and a third feedback transistor and controlled by the latch control signal,
the third feedback transistor coupled between the second feedback transistor and the latch control signal, and controlled by the inverted latched enable signal, and
wherein the latched enable signal is generated, at least in part, by the voltage at a junction of the second feedback transistor and the third feedback transistor.

10. The method of claim 8, wherein the latch control portion includes:
a clocked portion comprising:
a first clocked transistor coupled between a voltage source and a second clocked transistor and controlled by the input enable signal,
the second clocked transistor coupled between the first clocked transistor and a third clocked transistor and controlled by the ungated clock signal, and
the third clocked transistor coupled between the second clocked transistor and a voltage sink and controlled by the ungated clock signal, wherein the latch control signal is generated, at least in part, by the voltage at a junction of the second clocked transistor and the third clocked transistor, and an enable portion comprising:
a transmission gate coupled between the clock gating portion and a first enable transistor and controlled by the latched enable signal,
the first enable transistor coupled between the transmission gate and a second enable transistor and controlled by an inverted latched enable signal, and
the second enable transistor coupled between the first enable transistor and the voltage sink and controlled by the input enable signal,
wherein the latch control signal is generated, at least in part, by the voltage at a junction of the transmission gate and the first enable transistor.

11. The method of claim 10, wherein generating the latch control signal comprises, if both the latched enable signal and the input enable signal are both in a disabled state:
turning off the transmission gate and the first clocked transistor;
turning on the first enable transistor and the second enable transistor; and
sinking the latch control signal to the voltage of the voltage sink.

12. The method of claim 10, wherein generating the latch control signal comprises, if either the latched enable signal and the input enable signal are in the enabled state:
turning on the transmission gate or the first clocked transistor;
turning off the first enable transistor and the second enable transistor; and
coupling the latch control signal to the ungated clock signal, such that the latch control signal follows the ungated clock signal.

13. The method of claim 8, wherein latching comprises not consuming switching power when the latch control signal is in a disabled state.

14. The method of claim 8, further comprising limiting a dynamic power consumption by limiting a pin capacitance associated with the ungated clock signal to a control circuit and an invertor.

15. An apparatus comprising:
an execution unit configured to perform a logic function in accordance with a gated clock signal;
a clock circuit configured to generate an ungated clock signal; and
an integrated clock gating circuit configured to generate the gated clock signal from the ungated clock signal and at least one input enable signal,
wherein the integrated clock gating circuit comprises:
a latch configured to receive an input enable signal and generate a latched enable signal, wherein the latch is also configured to pass a value from the input enable signal to the latched enable signal only when the latch is transparent, and
a control circuit configured to receive as input the ungated clock signal, and generate the gated clock signal and a latch control signal,
wherein the latch control signal is configured to make the latch transparent only when the ungated clock signal is in a predefined state and either the input enable signal or the latched enable signal are in an enabled state,
wherein the control circuit is configured to pass a value from the ungated clock signal to the gated clock signal when the latched enable signal is in the enabled state, and
wherein the control circuit comprises:
a clock gating portion configured to generate the gated clock signal, and
a latch control portion configured to generate the latch control signal,
wherein, when the latched enable signal is in the enabled state, an inverted version of the gated clock signal is an input to the latch control portion.

16. The apparatus of claim 15, wherein the latch comprises:
a latching portion comprising:
a first latch transistor coupled to a voltage source and a second latch transistor and controlled by the input enable signal,
the second latch transistor coupled between the first latch transistor and a third latch transistor and controlled by an inverted latch control signal,
the third latch transistor coupled between the second latch transistor and a fourth latch transistor and controlled by the latch control signal,
the fourth latch transistor coupled between the third latch transistor and a voltage sink and controlled by the input enable signal, and
wherein the latched enable signal is generated, at least in part, by the voltage at a junction of the second latch transistor and the third latch transistor; and
a feedback portion comprising:
an invertor configured to invert the latched enable signal to an inverted latched enable signal, and
a first feedback transistor coupled between the voltage source and a second feedback transistor and controlled by the inverted latched enable signal,
the second feedback transistor coupled between the first feedback transistor and a third feedback transistor and controlled by the latch control signal,
the third feedback transistor coupled between the second feedback transistor and the latch control signal, and controlled by the inverted latched enable signal, and
wherein the latched enable signal is generated, at least in part, by the voltage at a junction of the second feedback transistor and the third feedback transistor.

17. The apparatus of claim 15, wherein the latch control portion includes:
a clocked portion comprising:
a first clocked transistor coupled between a voltage source and a second clocked transistor and controlled by the input enable signal,
the second clocked transistor coupled between the first clocked transistor and a third clocked transistor and controlled by the ungated clock signal, and
the third clocked transistor coupled between the second clocked transistor and a voltage sink and controlled by the ungated clock signal,
wherein the latch control signal is generated, at least in part, by the voltage at a junction of the second clocked transistor and the third clocked transistor; and
an enable portion comprising:
a transmission gate coupled between the clock gating portion and a first enable transistor and controlled by the latched enable signal, the first enable transistor coupled between the transmission gate and a second enable transistor and controlled by an inverted latched enable signal, and the second enable transistor coupled between the first enable transistor and the voltage sink and controlled by the input enable signal, wherein the latch control signal is generated, at least in part, by the voltage at a junction of the transmission gate and the first enable transistor.

\* \* \* \* \*